US012777625B2

(12) United States Patent
Zhu

(10) Patent No.: US 12,777,625 B2
(45) Date of Patent: Oct. 27, 2026

(54) DISPLAY MODULE AND MANUFACTURING METHOD THEREOF

(71) Applicant: Wuhan China Star Optoelectronics Semiconductor Display Technology Co., Ltd., Wuhan (CN)

(72) Inventor: Defu Zhu, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 1477 days.

(21) Appl. No.: 17/284,800

(22) PCT Filed: Mar. 16, 2021

(86) PCT No.: PCT/CN2021/081011
§ 371 (c)(1),
(2) Date: Apr. 13, 2021

(87) PCT Pub. No.: WO2022/188195
PCT Pub. Date: Sep. 15, 2022

(65) Prior Publication Data

US 2026/0262204 A1 Sep. 3, 2026

(30) Foreign Application Priority Data

Mar. 9, 2021 (CN) ........................ 202110257730.X

(51) Int. Cl.
*H05K 7/20* (2006.01)
*G09F 9/30* (2006.01)

(52) U.S. Cl.
CPC ......... *H05K 7/20954* (2013.01); *G09F 9/301* (2013.01)

(58) Field of Classification Search
CPC ..... H05K 7/20954; G09F 9/301; G06F 1/203; B32B 15/08; B32B 15/082; B32B 15/09; B32B 15/20; B32B 15/32; B32B 15/36
See application file for complete search history.

(56) References Cited

U.S. PATENT DOCUMENTS 5,170,809 A * 12/1992 Imai ..................... A61C 15/048 132/322
10,212,811 B1 * 2/2019 Zhang ................... G06F 1/1652
10,796,613 B2 * 10/2020 Xu .......................... G09F 9/301
11,195,891 B2 * 12/2021 Han ..................... G09G 3/3225
2017/0358772 A1 * 12/2017 Sung .................... H10K 59/122
(Continued)

FOREIGN PATENT DOCUMENTS

CN 108847137 11/2018
CN 109360845 2/2019
(Continued)

*Primary Examiner* — Abhishek M Rathod

(57) ABSTRACT

A display module and a manufacturing method thereof are provided. The display module includes: a support layer disposed under a display panel which includes a first bending part and is defined with a groove corresponding to the first bending part, a heat dissipation buffer layer disposed under the support layer and provided with a second bending part corresponding to the first bending part, and a first adhesive layer disposed between the support layer and the heat dissipation buffer layer and provided with a first protrusion part filled in the groove and a second protrusion part connected to the second bending part.

20 Claims, 5 Drawing Sheets

(56) References Cited

U.S. PATENT DOCUMENTS

| | | | | |
|---|---|---|---|---|
| 2019/0081255 | A1* | 3/2019 | Kim | B32B 15/08 |
| 2020/0009803 | A1* | 1/2020 | Kang | B29C 65/48 |
| 2020/0194712 | A1* | 6/2020 | Choi | H10K 59/40 |
| 2021/0034121 | A1* | 2/2021 | Lee | G06F 1/203 |
| 2021/0036257 | A1* | 2/2021 | Lee | F28F 21/02 |
| 2022/0354003 | A1* | 11/2022 | Liu | B32B 27/365 |
| 2025/0126763 | A1* | 4/2025 | Wang | H05K 7/20963 |

FOREIGN PATENT DOCUMENTS

| | | | | |
|---|---|---|---|---|
| CN | 208938546 | | 6/2019 | |
| CN | 110165072 | A * | 8/2019 | H10K 50/841 |
| CN | 210836904 | | 6/2020 | |
| CN | 111415586 | | 7/2020 | |
| CN | 111816083 | | 10/2020 | |
| CN | 111976249 | | 11/2020 | |
| CN | 112071207 | | 12/2020 | |
| CN | 212085044 | | 12/2020 | |
| JP | 2013-228440 | | 11/2013 | |
| KR | 20090075288 | A * | 7/2009 | G02B 5/0231 |

* cited by examiner

DISPLAY MODULE AND MANUFACTURING METHOD THEREOF

RELATED APPLICATIONS

This application is a National Phase of PCT Patent Application No. PCT/CN2021/081011 having International filing date of Mar. 16, 2021, which claims the benefit of priority of Chinese Patent Application No. 202110257730.X filed on Mar. 9, 2021. The contents of the above applications are all incorporated by reference as if fully set forth herein in their entirety.

FIELD AND BACKGROUND OF THE INVENTION

The present disclosure relates to the field of display technologies, and more particularly to a display module and a manufacturing method thereof.

As requirements for full screen continue to increase, how to improve screen ratio of displays becomes an urgent problem that needs to be solved. At present, screen ratio of displays is usually increased by increasing bending angles of screens, such as waterfall screens and quad-curved screens in the current market. However, when bending angles of the screens are larger and bending edges are more, encapsulation layers are prone to be damaged and develop cracks from stresses when 3D curved lamination is performed on display panels, thereby causing poor display.

An embodiment of the present disclosure provides a display module and a manufacturing method thereof to prevent poor display.

SUMMARY OF THE INVENTION

An embodiment of the present disclosure provides a display module, which includes:

a display panel including at least one first bending part;

a support layer disposed under the display panel and defined with a groove corresponding to the first bending part;

a heat dissipation buffer layer disposed under the support layer and provided with a second bending part corresponding to the first bending part;

and a first adhesive layer disposed between the support layer and the heat dissipation buffer layer;

wherein, one side of the first adhesive layer away from the heat dissipation buffer layer is provided with a first protrusion part filled in the groove, and another side of the first adhesive layer adjacent to the heat dissipation buffer layer is provided with a second protrusion part connected to the second bending part.

In the display module of the present disclosure, the groove includes an opening and a bottom, the opening is disposed on a surface of the support layer adjacent to the first adhesive layer, and a width of the groove gradually increases from the opening to the bottom; and a width of the first protrusion part gradually increases from one end away from the display panel to another end adjacent to the display panel.

In the display module of the present disclosure, the bottom is an arc structure, and the end of the first protrusion part adjacent to the display panel is the arc structure matching the bottom.

In the display module of the present disclosure, the bottom is a zigzag structure, and the end of the first protrusion part adjacent to the display panel is the zigzag structure matching the bottom.

In the display module of the present disclosure, the groove includes a plurality of sub-grooves formed by extending from a plurality of sub-openings in a direction away from the second bending part, the first protrusion part includes a plurality of sub-protrusion parts, and each of the sub-protrusion parts is filled in each of the sub-grooves.

In the display module of the present disclosure, the display module further includes a coverplate disposed on the display panel and provided with a third bending part corresponding to the first bending part.

In the display module of the present disclosure, a second adhesive layer is disposed between the display panel and the support layer, the second adhesive layer is provided with a fourth bending part corresponding to the first bending part, and the fourth bending part connects the first bending part to the support layer.

In the display module of the present disclosure, the support layer includes polyethylene terephthalate (PET) material.

An embodiment of the present disclosure further provides another display module, which includes:

a display panel including at least one first bending part;

a support layer disposed under the display panel and defined with a groove corresponding to the first bending part;

a heat dissipation buffer layer disposed under the support layer and provided with a second bending part corresponding to the first bending part;

and a first adhesive layer disposed between the support layer and the heat dissipation buffer layer;

a coverplate disposed on the display panel and provided with a third bending part corresponding to the first bending part; and a second adhesive layer disposed between the display panel and the support layer and provided with a fourth bending part corresponding to the first bending part, wherein, the fourth bending part connects the first bending part to the support layer;

wherein, one side of the first adhesive layer away from the heat dissipation buffer layer is provided with a first protrusion part filled in the groove, and another side of the first adhesive layer adjacent to the heat dissipation buffer layer is provided with a second protrusion part connected to the second bending part.

In the display module of the present disclosure, the groove includes an opening and a bottom, the opening is disposed on a surface of the support layer adjacent to the first adhesive layer, and a width of the groove gradually increases from the opening to the bottom; and a width of the first protrusion part gradually increases from one end away from the display panel to another end adjacent to the display panel.

In the display module of the present disclosure, the bottom is an arc structure, and the end of the first protrusion part adjacent to the display panel is the arc structure matching the bottom.

In the display module of the present disclosure, the bottom is a zigzag structure, and the end of the first protrusion part adjacent to the display panel is the zigzag structure matching the bottom.

In the display module of the present disclosure, the groove includes a plurality of sub-grooves formed by extending from a plurality of sub-openings in a direction away from the second bending part, the first protrusion part includes a plurality of sub-protrusion parts, and each of the sub-protrusion parts is filled in each of the sub-grooves.

In the display module of the present disclosure, the support layer includes polyethylene terephthalate (PET) material.

An embodiment of the present disclosure further provides a manufacturing method of a display module. The method includes following steps:

providing a display panel and a support layer, wherein, the display panel includes at least one area to be bent;

forming a notch on the support layer corresponding to the area to be bent;

coating an adhesive material on a first surface of the support layer to form a first adhesive layer and filling the adhesive material into the notch to form filling colloid, wherein, the first adhesive layer has the filling colloid;

bending the display panel and the support layer to make the area to be bent of the display panel form a first bending part, wherein, the notch forms a groove corresponding to the first bending part, one side of the first adhesive layer adjacent to the support layer forms a first protrusion part filled in the groove, and another side of the first adhesive layer away from the support layer forms a second protrusion part; and providing a heat dissipation buffer layer including a second bending part disposed corresponding to the first bending part, wherein, the second bending part is connected to the second protrusion part.

In the manufacturing method of the display module of the present disclosure, a depth of the notch ranges from 20 μm to 50 μm.

In the manufacturing method of the display module of the present disclosure, the groove includes an opening and a bottom, the opening is disposed on a surface of the support layer adjacent to the first adhesive layer, and a width of the groove gradually increases from the opening to the bottom; and a width of the first protrusion part gradually increases from one end away from the display panel to another end adjacent to the display panel.

In the manufacturing method of the display module of the present disclosure, the bottom is an arc structure, and the end of the first protrusion part adjacent to the display panel is the arc structure matching the bottom.

In the manufacturing method of the display module of the present disclosure, the bottom is a zigzag structure, and the end of the first protrusion part adjacent to the display panel is the zigzag structure matching the bottom.

In the manufacturing method of the display module of the present disclosure, the groove includes a plurality of sub-grooves formed by extending from a plurality of sub-openings in a direction away from the second bending part, the first protrusion part includes a plurality of sub-protrusion parts, and each of the sub-protrusion parts is filled in each of the sub-grooves.

Beneficial effect: the display module provided in the embodiment of the present disclosure includes: the display panel including at least one first bending part; the support layer disposed under the display panel and provided with the groove corresponding to the first bending part; the heat dissipation buffer layer disposed under the support layer and provided with the second bending part corresponding to the first bending part; and the first adhesive layer disposed between the support layer and the heat dissipation buffer layer; wherein, one side of the first adhesive layer away from the heat dissipation buffer layer is provided with the first protrusion part filled in the groove, and another side of the first adhesive layer adjacent to the heat dissipation buffer layer is provided with the second protrusion part connected to the second bending part. Therefore, the display module of the present disclosure can prevent an encapsulation layer of the display panel from being damaged and having cracks when undergoing stresses, thereby preventing poor display. In addition, the display module of the present disclosure can also prevent the display panel from leaking light.

BRIEF DESCRIPTION OF THE SEVERAL VIEWS OF THE DRAWINGS

The accompanying figures to be used in the description of embodiments of the present disclosure will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED SPECIFIC EMBODIMENTS OF THE INVENTION

Figure 1:
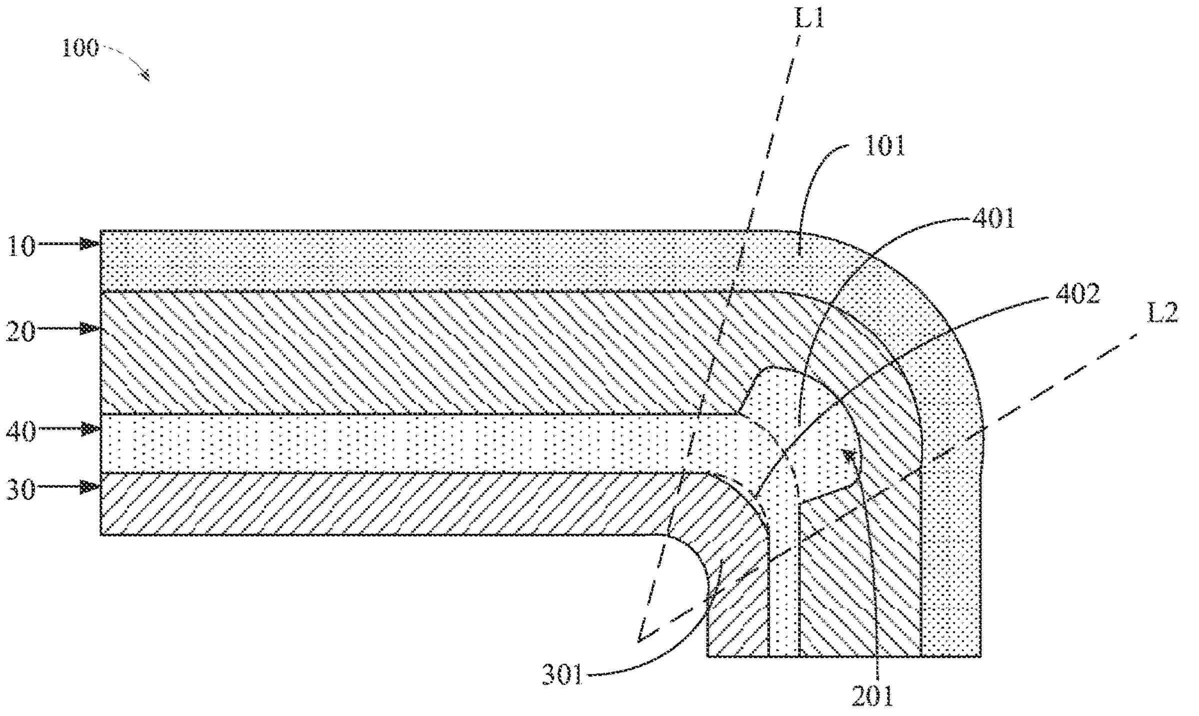
FIG. 1 is a first schematic structural diagram of a display module according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counter-clockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The following description provides many different embodiments or examples for implementing different structures of the present disclosure. In order to simplify the present disclosure, the components and settings of specific examples are described below. Of course, they are merely examples and are not intended to limit the present disclosure. In addition, the present disclosure may repeat reference numerals and/or reference letters in different examples, which are for the purpose of simplicity and clarity, and do not indicate the relationship between the various embodiments and/or arrangements discussed. In addition, the present disclosure provides examples of various specific processes and materials, but one of ordinary skill in the art will recognize the use of other processes and/or the use of other materials.

An embodiment of the present disclosure provides a display module, which includes:

a display panel including at least one first bending part;

a support layer disposed under the display panel and defined with a groove corresponding to the first bending part;

a heat dissipation buffer layer disposed under the support layer and provided with a second bending part corresponding to the first bending part;

and a first adhesive layer disposed between the support layer and the heat dissipation buffer layer;

wherein, one side of the first adhesive layer away from the heat dissipation buffer layer is provided with a first protrusion part filled in the groove, and another side of the first adhesive layer adjacent to the heat dissipation buffer layer is provided with a second protrusion part connected to the second bending part.

In an embodiment of the present disclosure, the groove includes an opening and a bottom, the opening is disposed on a surface of the support layer adjacent to the first adhesive layer, and a width of the groove gradually increases from the opening to the bottom; and a width of the first protrusion part gradually increases from one end away from the display panel to another end adjacent to the display panel.

In an embodiment of the present disclosure, the bottom is an arc structure, and the end of the first protrusion part adjacent to the display panel is the arc structure matching the bottom.

In an embodiment of the present disclosure, the bottom is a zigzag structure, and the end of the first protrusion part adjacent to the display panel is the zigzag structure matching the bottom.

In an embodiment of the present disclosure, the groove includes a plurality of sub-grooves formed by extending from a plurality of sub-openings in a direction away from the second bending part, the first protrusion part includes a plurality of sub-protrusion parts, and each of the sub-protrusion parts is filled in each of the sub-grooves.

In an embodiment of the present disclosure, the display module further includes a coverplate disposed on the display panel and provided with a third bending part corresponding to the first bending part.

In an embodiment of the present disclosure, a second adhesive layer is disposed between the display panel and the support layer, the second adhesive layer is provided with a fourth bending part corresponding to the first bending part, and the fourth bending part connects the first bending part to the support layer.

In an embodiment of the present disclosure, the support layer includes polyethylene terephthalate (PET) material.

An embodiment of the present disclosure provides the display module, which includes:

the display panel including at least one first bending part;

the support layer disposed under the display panel and provided with the groove corresponding to the first bending part;

the heat dissipation buffer layer disposed under the support layer and provided with the second bending part corresponding to the first bending part; and the first adhesive layer disposed between the support layer and the heat dissipation buffer layer;

the coverplate disposed on the display panel and provided with the third bending part corresponding to the first bending part; and the second adhesive layer disposed between the display panel and the support layer and provided with the fourth bending part corresponding to the first bending part, wherein, the fourth bending part connects the first bending part to the support layer;

wherein, one side of the first adhesive layer away from the heat dissipation buffer layer is provided with the first protrusion part filled in the groove, and another side of the first adhesive layer adjacent to the heat dissipation buffer layer is provided with the second protrusion part connected to the second bending part.

In an embodiment of the present disclosure, the groove includes the opening and the bottom, the opening is disposed on the surface of the support layer adjacent to the first adhesive layer, and the width of the groove gradually increases from the opening to the bottom; and the width of the first protrusion part gradually increases from one end away from the display panel to another end adjacent to the display panel.

In an embodiment of the present disclosure, the bottom is an arc structure, and the end of the first protrusion part adjacent to the display panel is the arc structure matching the bottom.

In an embodiment of the present disclosure, the bottom is a zigzag structure, and the end of the first protrusion part adjacent to the display panel is the zigzag structure matching the bottom.

In an embodiment of the present disclosure, the groove includes the plurality of sub-grooves formed by extending from the plurality of sub-openings in the direction away from the second bending part, the first protrusion part includes the plurality of sub-protrusion parts, and each of the sub-protrusion parts is filled in each of the sub-grooves.

In an embodiment of the present disclosure, the support layer includes PET material.

Referring to FIG. 1, FIG. 1 is a first schematic structural diagram of the display module 100 according to an embodiment of the present disclosure. The display module 100 includes the display panel 10, the support layer 20, the heat dissipation buffer layer 30, and the first adhesive layer 40.

The display panel 10 includes at least one first bending part 101. The support layer 20 is disposed under the display panel 10. The support layer 20 is defined with a groove 201 corresponding to the first bending part 101. The heat dissipation buffer layer 30 is disposed under the support layer 20. The heat dissipation buffer layer 30 is provided with the second bending part 301 corresponding to the first bending part 101. The first adhesive layer 40 is disposed between the support layer 20 and the heat dissipation buffer layer 30.

Wherein, one side of the first adhesive layer 40 away from the heat dissipation buffer layer 30 is provided with the first protrusion part 401. The first protrusion part 401 is filled in the groove 201. Another side of the first adhesive layer 40 adjacent to the heat dissipation buffer layer 30 is provided with the second protrusion part 402. The second protrusion part 402 is connected to the second bending part 301.

Wherein, when the display module 100 is bonded to a coverplate (not shown in the figure) of a curved screen, a bending part formed by lines L1 and L2 will form, which corresponds to the first bending part 101 of the display panel 10 and the second bending part 301 of the heat dissipation buffer layer 30.

In related techniques, when the display module is bonded to the coverplate (not shown in the figure) of the curved screen, each layer structure of the display module needs to be bent, so each layer structure includes a bending part, a main body part, and an auxiliary body part connected to the main body part by bending the bending part. Since the support layer has greater Young's modulus, a neutral layer corresponding to the bending part of each layer structure is usually near the bending part of the support layer when bending each layer structure of the display module. That is, the neutral layer is under a bending part of an encapsulation layer of the display panel. Wherein, the neutral layer is under the least stress, and the farther away it is from the neutral layer, the greater the stress. Conversely, the closer it is to the neutral layer, the less the stress. Since the neutral layer is under the bending part of the encapsulation layer and is not adjacent to the bending part of the encapsulation layer, the encapsulation layer is under a greater stress. Therefore, when bending each layer structure of the display module, the encapsulation layer is prone to be damaged and develops cracks from the stress, thereby causing poor display.

In order to solve the problem of poor display, a predetermined area of the support layer 20 can be thinned before bending each layer structure of the display module 100. Therefore, Young's modulus of the predetermined area can be reduced, and the neutral layer can move up to a vicinity of the encapsulation layer of the display panel. It can allow the encapsulation layer to experience a relatively small stress when bending each layer structure of the display module 100, thereby preventing the encapsulation layer from being damaged and developing cracks by the greater stress and preventing poor display. Wherein, after bending the support layer 20, the bending part of the support layer 20 is formed in the predetermined area. Specifically, a notch can be defined in the predetermined area of the support layer 20 to thin the predetermined area. After bending the display module 100, the notch forms the groove 201.

In related techniques, a phenomenon of false attachment of the display module is prone to occur between the heat dissipation buffer layer and the support layer. That is, there is a gap between the bending part of the support layer and a bending part of an adhesive layer between the support layer and the heat dissipation buffer layer, thereby causing the heat dissipation buffer layer to be unable to attach to the support layer tightly. It can also be said that there is a gap between a bending part of the heat dissipation buffer layer and the bending part of the adhesive layer between the support layer and the heat dissipation buffer layer, thereby causing the heat dissipation buffer layer to be unable to attach to the support layer tightly.

In order to solve the phenomenon of false attachment, one side of the first adhesive layer 40 away from the heat dissipation buffer layer 20 is provided with the first protrusion part 401 to allow the first protrusion part 401 to fill in the groove 201, and another side of the first adhesive layer 40 adjacent to the heat dissipation buffer layer 30 is provided with the second protrusion part 402 connected to the second bending part 301. Therefore, the false attachment problem between the heat dissipation buffer layer 30 and the support layer 20 of the display module 100 can be solved by attaching the first protrusion part 401 to inner walls of the groove 201 and attaching the second protrusion part 402 to the second bending part 301.

The display module provided in this embodiment of the present disclosure includes: the display panel including the at least one first bending part; the support layer disposed under the display panel and provided with the groove corresponding to the first bending part; the heat dissipation buffer layer disposed under the support layer and provided with the second bending part corresponding to the first bending part; and the first adhesive layer disposed between the support layer and the heat dissipation buffer layer; wherein, the one side of the first adhesive layer away from the heat dissipation buffer layer is provided with the first protrusion part filled in the groove, and another side of the first adhesive layer adjacent to the heat dissipation buffer layer is provided with the second protrusion part connected to the second bending part. Therefore, the display module of the present disclosure can prevent the encapsulation layer of the display panel from being damaged and having cracks when under stresses, thereby preventing poor display. In addition, the display module of the present disclosure can also prevent the display panel from leaking light.

Specifically, the display panel 10 may include a double-layered polyimide (PI) substrate, an array layer, a light-emitting layer, and the encapsulation layer disposed on the PI substrate in sequence. The encapsulation layer consists of a first inorganic encapsulation layer, an organic encapsulation layer, and a second inorganic encapsulation layer formed by inkjet printing (IJP) and chemical vapor deposition (CVD). The PI substrate is a polyimide film substrate, i.e., a flexible substrate. The support layer 20 may include polyethylene terephthalate (PET) material.

Figure 2:
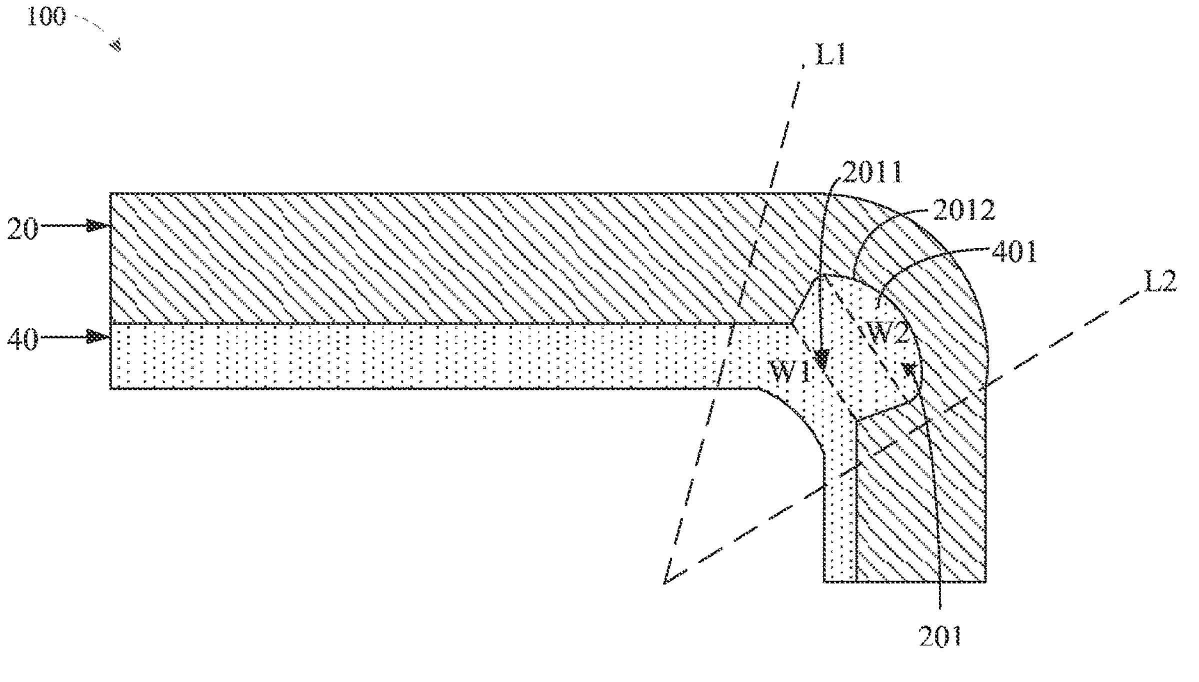
FIG. 2 is a first schematic structural diagram of a support layer and a first adhesive layer attached to each other according to an embodiment of the present disclosure.

In some embodiments, as shown in FIG. 2, FIG. 2 is a first schematic structural diagram of the support layer 20 and the first adhesive layer 40 attached to each other according to an embodiment of the present disclosure.

Wherein, the groove 201 includes the opening 2011 and the bottom 2012. The opening 2011 is disposed on the surface of the support layer 20 adjacent to the first adhesive layer 40, and the width of the groove 201 gradually increases from the opening 2011 to the bottom 2012. The width of the first protrusion part 401 gradually increases from one end away from the display panel 10 to another end adjacent to the display panel 10.

Wherein, the groove 201 defined in the support layer 20 includes the opening 2011 defined on the surface of the bending part of the support layer 10 adjacent to the first adhesive layer 40 and the bottom 2012 of the groove 201 formed by extending from the opening 2011 in a direction of the display panel 10. The groove 201 may be a space for accommodating the first protrusion part 401.

Specifically, the width of the first protrusion part 401 gradually increases from the one end (W1) away from the display panel 10 to another end (W2) adjacent to the display panel 10.

In some embodiments, the bottom 2012 is the arc structure, and the end of the first protrusion part 401 adjacent to the display panel 10 is the arc structure matching the bottom 2012.

Wherein, in order to allow the first protrusion part 401 to be closely attached to the groove 201, the bottom 2012 of the groove 201 may be defined as the arc structure with a predetermined radian, and the end of the first protrusion part 401 adjacent to the display panel 10 may also be defined as the arc structure correspondingly, thereby allowing the first protrusion part 401 to be fit with the bottom 2012 with the arc structure in the groove 201 by a top surface of the arc structure.

Figure 3:
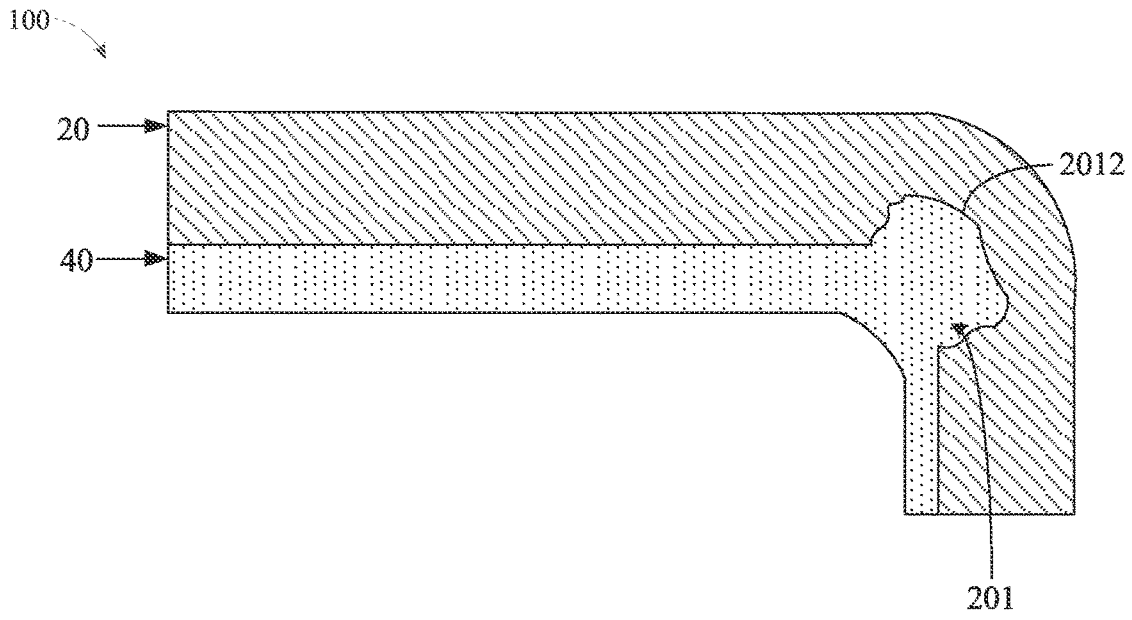
FIG. 3 is a second schematic structural diagram of the support layer and the first adhesive layer attached to each other according to an embodiment of the present disclosure.

In some embodiments, as shown in FIG. 3, FIG. 3 is a second schematic structural diagram of the support layer 20 and the first adhesive layer 40 attached to each other according to an embodiment of the present disclosure. The bottom 2012 is the zigzag structure, and the end of the first protrusion part 401 adjacent to the display panel 10 is the zigzag structure matching the bottom 2012.

Wherein, a structural setting for allowing the first protrusion part 401 to be closely attached to the groove 201 may also be: defining the bottom 2012 as the zigzag structure and defining the end of the first protrusion part 401 adjacent to the display panel 10 as the zigzag structure correspondingly, thereby allowing the first protrusion part 401 to be closely fit with the groove 201.

Continue to refer to FIG. 3, in some embodiments, in order to allow the first protrusion part 401 to be more closely fit with the groove 201, side walls of the groove 201 may also be defined as the zigzag structure, and sides of the first protrusion part 401 are also defined as the zigzag structure correspondingly.

Figure 4:
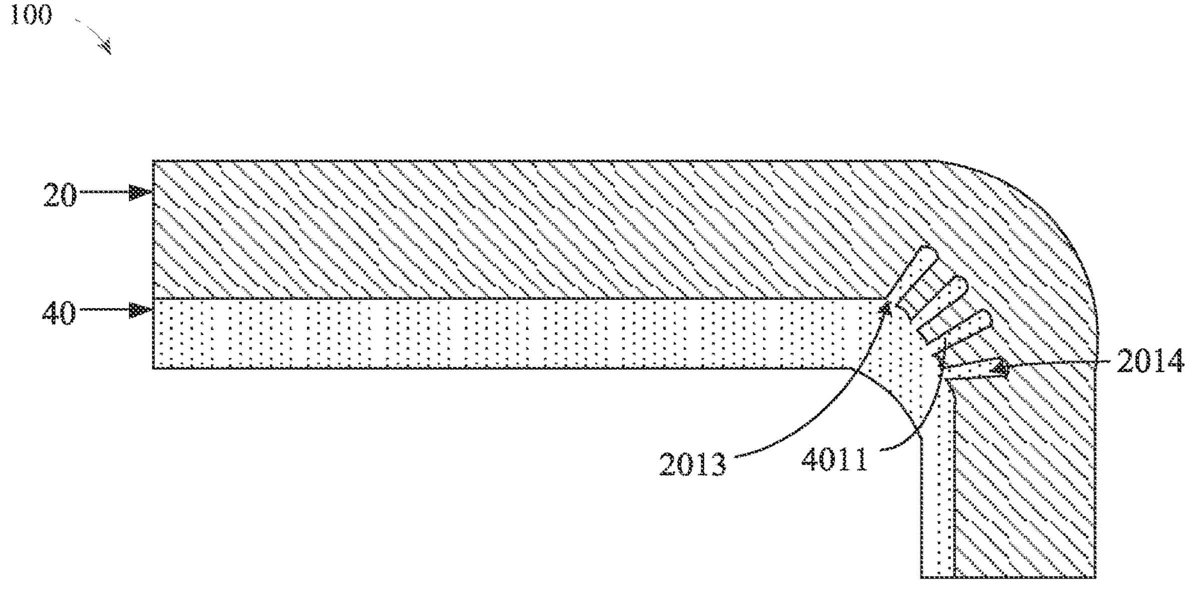
FIG. 4 is a third schematic structural diagram of the support layer and the first adhesive layer attached to each other according to an embodiment of the present disclosure.

In some embodiments, as shown in FIG. 4, FIG. 4 is a third schematic structural diagram of the support layer 20 and the first adhesive layer 40 attached to each other according to an embodiment of the present disclosure. The groove 201 includes the plurality of sub-grooves 2014 formed by extending from the plurality of sub-openings 2013 in a direction away from the second bending part 301. The first protrusion part 401 includes the plurality of sub-protrusion parts 4011. Each of the sub-protrusion parts 4011 is filled in each of the sub-grooves 2014.

Wherein, the groove 201 may be defined as the plurality of sub-grooves 2014 arranged at intervals, the first protrusion part 401 may be correspondingly defined as the plurality of sub-protrusion parts 4011 arranged at intervals, and one sub-groove 2014 corresponds to one sub-protrusion part 4011, thereby allowing the first protrusion part 401 to be closely attached to the groove 201.

Figure 5:
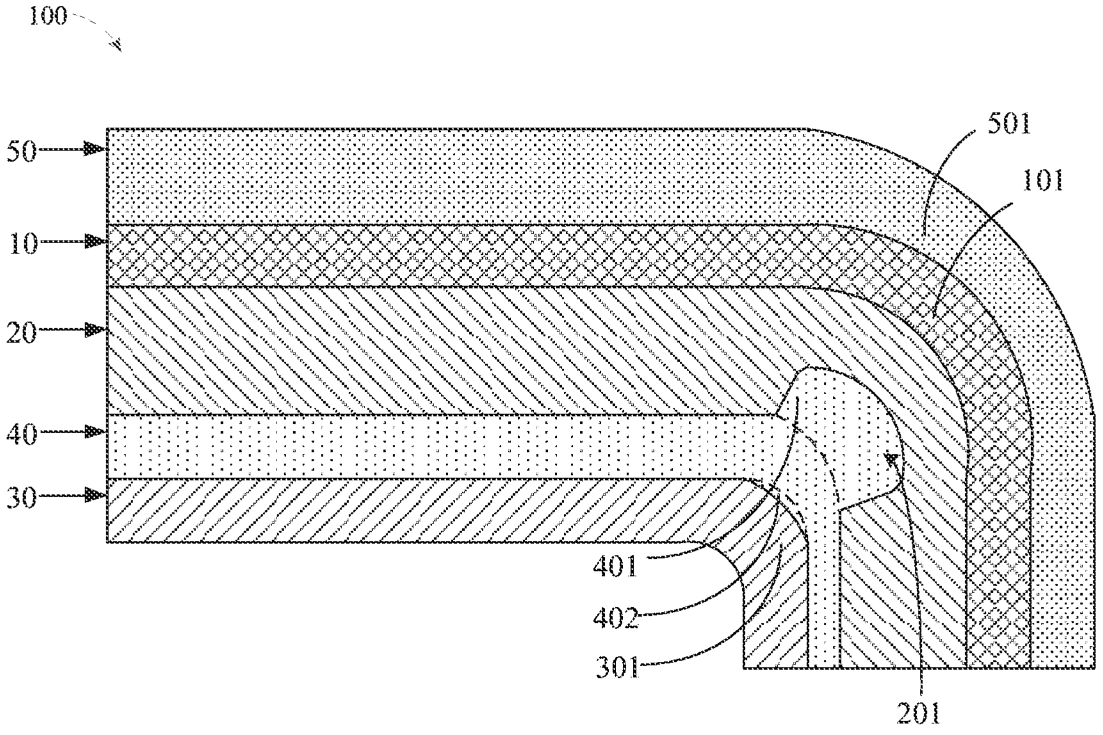
FIG. 5 is a second schematic structural diagram of the display module according to an embodiment of the present disclosure.

In some embodiments, as shown in FIG. 5, FIG. 5 is a second schematic structural diagram of the display module according to an embodiment of the present disclosure. Wherein, the display module 100 further includes the coverplate 50. The coverplate 50 is disposed on the display panel 10 and provided with the third bending part 501 corresponding to the first bending part 101.

Wherein, it is the display panel 10 of the display module 100 that is attached to the coverplate 50 when bonding to the coverplate 50, and the first bending part 101 is attached to the third bending part 501.

The display module provided in this embodiment of the present disclosure includes: the display panel including the at least one first bending part; the support layer disposed under the display panel and provided with the groove corresponding to the first bending part; the heat dissipation buffer layer disposed under the support layer and provided with the second bending part corresponding to the first bending part; and the first adhesive layer disposed between the support layer 20 and the heat dissipation buffer layer; wherein, the one side of the first adhesive layer away from the heat dissipation buffer layer is provided with the first protrusion part filled in the groove, and another side of the first adhesive layer adjacent to the heat dissipation buffer layer is provided with the second protrusion part connected to the second bending part. Therefore, the display module of the present disclosure can prevent the encapsulation layer of the display panel from being damaged and developing cracks when under stresses, thereby preventing poor display. In addition, the display module of the present disclosure can also prevent the display panel from leaking light.

An embodiment of the present disclosure further provides a manufacturing method of the display module. The method includes following steps:

- providing the display panel and the support layer, wherein, the display panel includes at least one area to be bent;
- forming the notch on the support layer corresponding to the area to be bent;
- coating an adhesive material on a first surface of the support layer to form the first adhesive layer and filling the adhesive material into the notch to form filling colloid, wherein, the first adhesive layer has the filling colloid;
- bending the display panel and the support layer to make the area to be bent of the display panel form the first bending part, wherein, the notch forms the groove corresponding to the first bending part, the one side of the first adhesive layer adjacent to the support layer forms the first protrusion part filled in the groove, and another side of the first adhesive layer away from the support layer forms the second protrusion part; and providing the heat dissipation buffer layer including the second bending part disposed corresponding to the first bending part, wherein, the second bending part is connected to the second protrusion part.

In the embodiment, the depth of the notch ranges from 20 μm to 50 μm.

In the embodiment, the groove includes the opening and the bottom, the opening is disposed on the surface of the support layer adjacent to the first adhesive layer, and the width of the groove gradually increases from the opening to the bottom; and the width of the first protrusion part gradually increases from the one end away from the display panel to another end adjacent to the display panel.

In this embodiment of the present disclosure, the bottom is the arc structure, and the end of the first protrusion part adjacent to the display panel is the arc structure matching the bottom.

In this embodiment of the present disclosure, the bottom is the zigzag structure, and the end of the first protrusion part adjacent to the display panel is the zigzag structure matching the bottom.

In the embodiment of the present disclosure, the groove includes the plurality of sub-grooves formed by extending from the plurality of sub-openings in the direction away from the second bending part, the first protrusion part includes the plurality of sub-protrusion parts, and each of the sub-protrusion parts is filled in a corresponding sub-groove.

Figure 6:
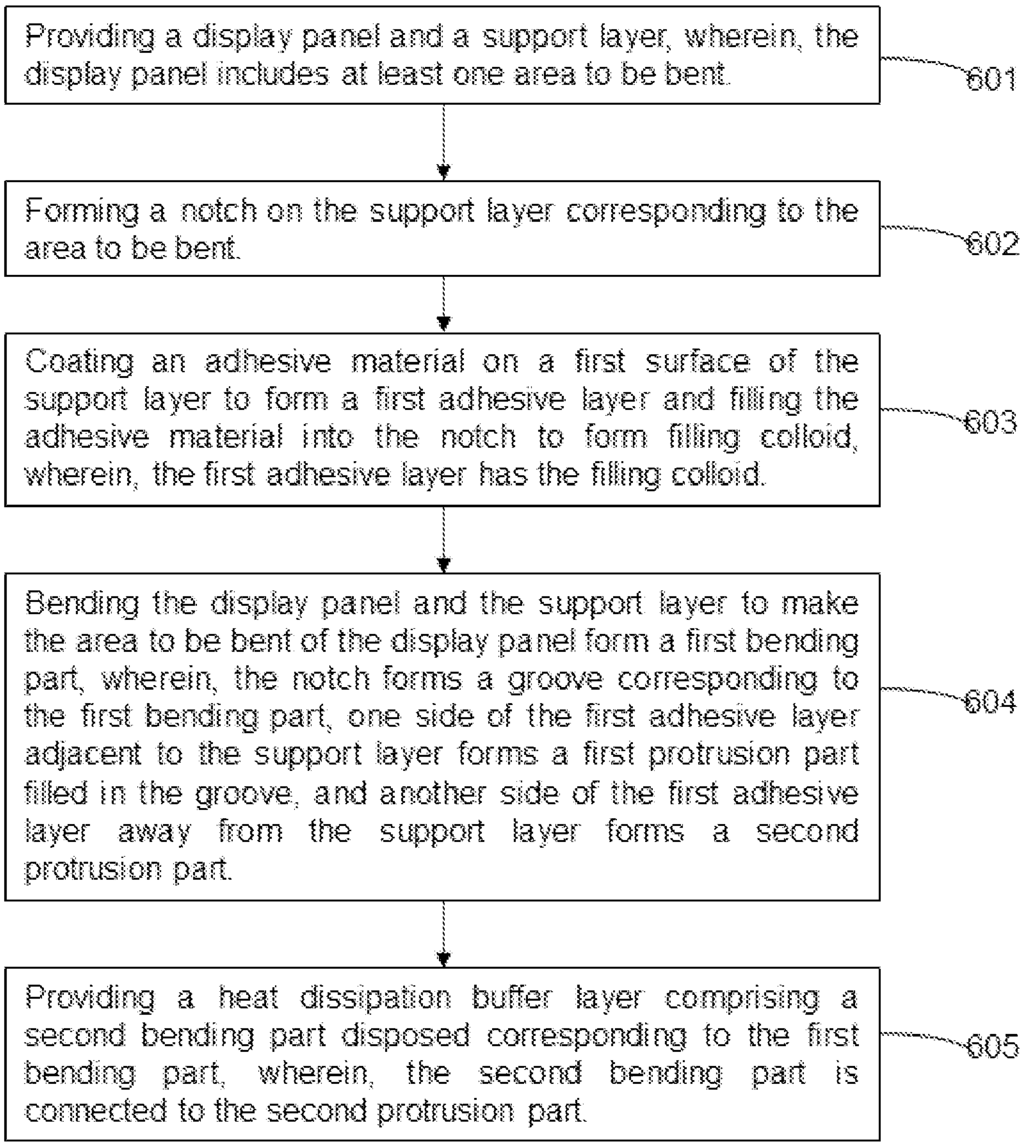
FIG. 6 is a flowchart of a manufacturing method of the display module according to an embodiment of the present disclosure.
Figure 7:
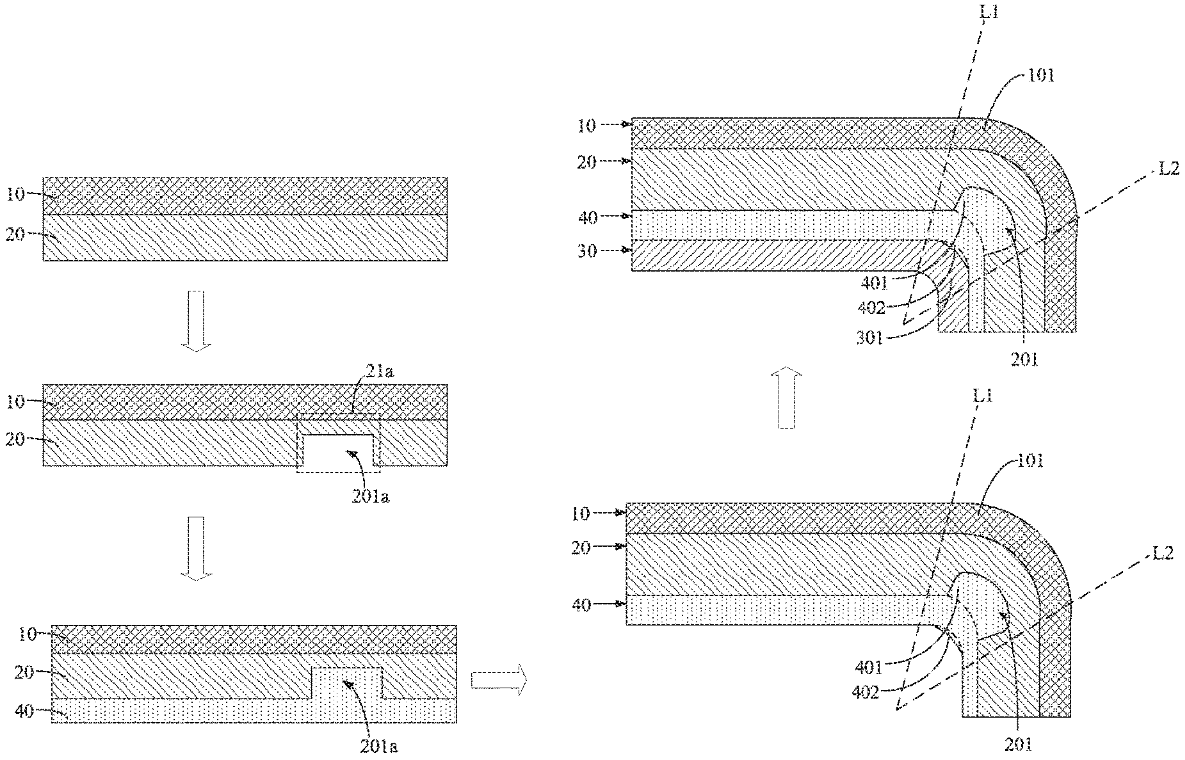
FIG. 7 is a schematic processing diagram corresponding to each step of the manufacturing method of the display module in FIG. 6 according to an embodiment of the present disclosure.

Referring to FIGS. 6 and 7, FIG. 6 is a flowchart of the manufacturing method of the display module according to an embodiment of the present disclosure, and FIG. 7 is a schematic processing diagram corresponding to each step of the manufacturing method of the display module in FIG. 6. The manufacturing method includes:

step 601: providing the display panel 10 and the support layer 20, wherein the display panel 10 includes at least one area to be bent.

Wherein, the display panel 10 may include the double-layered polyimide (PI) substrate, the array layer, the light-emitting layer, and the encapsulation layer disposed on the PI substrate in sequence. The encapsulation layer consists of the first inorganic encapsulation layer, the organic encapsulation layer, and the second inorganic encapsulation layer formed by inkjet printing (IJP) and chemical vapor deposition (CVD). The PI substrate is the polyimide film substrate, that is, the flexible substrate. The heat dissipation buffer layer 30 includes a sub adhesive layer, a sub graphite layer, a sub PI layer, a sub heat dissipation buffer layer, and a sub copper layer.

Step 602: forming the notch 201*a* on the support layer 20 corresponding to the area to be bent.

In related techniques, when the display module is bonded to the coverplate (not shown in the figure) of the curved screen, each layer structure of the display module needs to be bent, so each layer structure includes the bending part, the main body part, and the auxiliary body part connected to the main body part by bending the bending part. Since the support layer has a larger Young's modulus, the neutral layer corresponding to the bending part of each layer structure is usually near the bending part of the support layer when bending each layer structure of the display module. That is, the neutral layer is under the bending part of the encapsulation layer of the display panel. Wherein, the neutral layer is under the least stress, and the farther away it is from the neutral layer, the greater the stress. Conversely, the closer it is to the neutral layer, the smaller the stress. Since the neutral layer is under the bending part of the encapsulation layer and is not adjacent to the bending part of the encapsulation layer, the encapsulation layer is under greater stress. Therefore, when bending each layer structure of the display module, the encapsulation layer is prone to be damaged and develops cracks from the stress, thereby causing poor display.

In this embodiment, in order to solve the poor display, before bending each layer structure of the display module 100, the predetermined area 21*a* of the support layer 20, that is the support layer 20 corresponding to the area to be bent, can be thinned to reduce the Young's modulus of the predetermined area 21*a*, thereby allowing the neutral layer to move up to the vicinity of the encapsulation layer of the display panel 10. It can allow the encapsulation layer to undergo the relatively small stress when bending each layer structure of the display module 100, thereby preventing the encapsulation layer from being damaged and developing cracks from greater stress and preventing poor display. Wherein, after bending the support layer 20, the bending part of the support layer 20 is formed in the predetermined area 21*a*. Specifically, the notch 201*a* can be defined in the predetermined area 21*a* of the support layer 20 to thin the predetermined area 21*a*. After bending the display module 100, the notch 201*a* forms the groove 201.

In some embodiments, before bonding each layer structure of the display module, a design drawing will usually be formed, and the design drawing may include a specific position of a bending area on the support layer 20. Wherein, under ideal circumstances, a position of the bending part formed after bending the support layer 20 on the support layer 20 corresponds to the position of the bending area on the support layer 20. That is, a starting position of the bending part of the support layer 20 is same as a starting position of the bending area, and a finishing position of the bending part of the support layer 20 is also same as a finishing position of the bending area. However, when actually bonding, the position of the bending part on the support layer 20 does not actually correspond to the position of the bending area on the support layer 20. That is, the starting position of the bending part of the support layer 20 is not the same as the starting position of the bending area, and the finishing position of the bending part of the support layer 20 is not the same as the finishing position of the bending area, either. Based on the above-mentioned circumstances, a width of the predetermined area 21*a* may be allowed to be greater than a width of the bending area, thereby allowing a width of the notch 201*a* to be greater than the width of the bending area. Therefore, the bending part formed after bending the support layer 20 subsequently can be positioned in the predetermined area 21*a*. That is, the starting position of the bending part of the support layer 20 is larger than a starting position of the predetermined area 21*a*, or the finishing position of the bending part of the support layer 20 is smaller than a finishing position of the predetermined area 21*a*.

Specifically, the depth of the notch 201*a* may range from 20 μm to 50 μm.

Step 603: coating the adhesive material on the first surface of the support layer 20 to form the first adhesive layer 40 and filling the adhesive material into the notch 201*a* to form the filling colloid, wherein, the first adhesive layer 40 has the filling colloid.

Wherein, the first adhesive layer 40 formed on the first surface of the support layer 20 is configured to attach the support layer 20 to the heat dissipation buffer layer 30.

Step 604: bending the display panel 10 and the support layer 20 to make the area to be bent of the display panel 10 form the first bending part 101, wherein, the notch 201*a* forms the groove 201 corresponding to the first bending part 101, the one side of the first adhesive layer 40 adjacent to the support layer 20 forms the first protrusion part 401 filled in the groove 201, and another side of the first adhesive layer 40 away from the support layer 20 forms the second protrusion part 402.

Wherein, in order to attach the display panel 10 and the support layer 20 to the coverplate of the curved screen such as a waterfall screen or a quad-curved screen, the display panel 10 and the support layer 20 need to be bent, thereby allowing each layer structure of the display panel 10 and the support layer 20 to have bending parts and non-bending parts, and since the notch 201*a* is also bent, the notch 201*a* forms the groove 201, colloid filled in the groove 201 overflows according to a capacity of the notch, and a part of the colloid will be accommodated in the groove 201, thereby forming the first protrusion part 401 and the second protrusion part 402 corresponding thereto.

Step 605: providing the heat dissipation buffer layer 30 including the second bending part 301 disposed corresponding to the first bending part 101, wherein the second bending part 301 is connected to the second protrusion part 202.

Wherein, the phenomenon of false attachment can be prevented by attaching the second protrusion part 402 formed by overflowing to the second bending part 301 of the heat dissipation buffer layer 30 and attaching the first protrusion part 401 to the groove 201, thereby attaching the heat dissipation buffer layer 30 to the support layer 20 through the first adhesive layer 40.

In the above embodiments, the description of each embodiment has its own emphasis. For the parts that are not described in detail in an embodiment, refer to the detailed description of other embodiments above.

The display module and the manufacturing method thereof provided by the embodiments of the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display module, comprising:

a display panel comprising at least one first bending part;

a support layer disposed under the display panel and defined with a groove corresponding to the first bending part;

a heat dissipation buffer layer disposed under the support layer and provided with a second bending part corresponding to the first bending part; and a first adhesive layer disposed between the support layer and the heat dissipation buffer layer, wherein one side of the first adhesive layer away from the heat dissipation buffer layer is provided with a first protrusion part filled in the groove, and another side of the first adhesive layer adjacent to the heat dissipation buffer layer is provided with a second protrusion part connected to the second bending part.

2. The display module according to claim 1, wherein the groove comprises an opening and a bottom, the opening is disposed on a surface of the support layer adjacent to the first adhesive layer, and a width of the groove gradually increases from the opening to the bottom; and a width of the first protrusion part gradually increases from one end away from the display panel to another end adjacent to the display panel.

3. The display module according to claim 2, wherein the bottom is an arc structure, and the end of the first protrusion part adjacent to the display panel is the arc structure matching the bottom.

4. The display module according to claim 2, wherein the bottom is a zigzag structure, and the end of the first protrusion part adjacent to the display panel is the zigzag structure matching the bottom.

5. The display module according to claim 1, wherein the groove comprises a plurality of sub-grooves formed by extending from a plurality of sub-openings in a direction away from the second bending part, the first protrusion part comprises a plurality of sub-protrusion parts, and each of the sub-protrusion parts is filled in a corresponding sub-groove.

6. The display module according to claim 1, wherein the display module further comprises a coverplate disposed on the display panel and provided with a third bending part corresponding to the first bending part.

7. The display module according to claim 6, wherein a second adhesive layer is disposed between the display panel and the support layer, the second adhesive layer is provided with a fourth bending part corresponding to the first bending part, and the fourth bending part connects the first bending part to the support layer.

8. The display module according to claim 1, wherein the support layer comprises polyethylene terephthalate (PET) material.

9. A display module, comprising:

a display panel comprising at least one first bending part;

a support layer disposed under the display panel and defined with a groove corresponding to the first bending part;

a heat dissipation buffer layer disposed under the support layer and provided with a second bending part corresponding to the first bending part;

a first adhesive layer disposed between the support layer and the heat dissipation buffer layer;

a coverplate disposed on the display panel and provided with a third bending part corresponding to the first bending part; and a second adhesive layer disposed between the display panel and the support layer and provided with a fourth bending part corresponding to the first bending part, wherein the fourth bending part connects the first bending part to the support layer, wherein one side of the first adhesive layer away from the heat dissipation buffer layer is provided with a first protrusion part filled in the groove, and another side of the first adhesive layer adjacent to the heat dissipation buffer layer is provided with a second protrusion part connected to the second bending part.

10. The display module according to claim 9, wherein the groove comprises an opening and a bottom, the opening is disposed on a surface of the support layer adjacent to the first adhesive layer, and a width of the groove gradually increases from the opening to the bottom; and a width of the first protrusion part gradually increases from one end away from the display panel to another end adjacent to the display panel.

11. The display module according to claim 10, wherein the bottom is an arc structure, and the end of the first protrusion part adjacent to the display panel is the arc structure matching the bottom.

12. The display module according to claim 10, wherein the bottom is a zigzag structure, and the end of the first protrusion part adjacent to the display panel is the zigzag structure matching the bottom.

13. The display module according to claim 9, wherein the groove comprises a plurality of sub-grooves formed by extending from a plurality of sub-openings in a direction away from the second bending part, the first protrusion part comprises a plurality of sub-protrusion parts, and each of the sub-protrusion parts is filled in each of the sub-grooves.

14. The display module according to claim 9, wherein the support layer comprises polyethylene terephthalate (PET) material.

15. A manufacturing method of a display module, comprising following steps:

providing a display panel and a support layer, wherein the display panel comprises at least one area to be bent;

forming a notch on the support layer corresponding to the area to be bent;

coating an adhesive material on a first surface of the support layer to form a first adhesive layer and filling the adhesive material into the notch to form filling colloid, wherein the first adhesive layer has the filling colloid;

bending the display panel and the support layer to make the area to be bent of the display panel form a first bending part, wherein the notch forms a groove corresponding to the first bending part, one side of the first adhesive layer adjacent to the support layer forms a first protrusion part filled in the groove, and another side of the first adhesive layer away from the support layer forms a second protrusion part; and providing a heat dissipation buffer layer comprising a second bending part disposed corresponding to the first bending part, wherein the second bending part is connected to the second protrusion part.

16. The manufacturing method of the display module according to claim 15, wherein a depth of the notch ranges from 20 μm to 50 μm.

17. The manufacturing method of the display module according to claim 15, wherein the groove comprises an opening and a bottom, the opening is disposed on a surface of the support layer adjacent to the first adhesive layer, and a width of the groove gradually increases from the opening to the bottom; and a width of the first protrusion part gradually increases from one end away from the display panel to another end adjacent to the display panel.

18. The manufacturing method of the display module according to claim 17, wherein the bottom is an arc structure, and the end of the first protrusion part adjacent to the display panel is the arc structure matching the bottom.

19. The manufacturing method of the display module according to claim 17, wherein the bottom is a zigzag structure, and the end of the first protrusion part adjacent to the display panel is the zigzag structure matching the bottom.

20. The manufacturing method of the display module according to claim 15, wherein the groove comprises a plurality of sub-grooves formed by extending from a plurality of sub-openings in a direction away from the second bending part, the first protrusion part comprises a plurality of sub-protrusion parts, and each of the sub-protrusion parts is filled in a corresponding sub-groove.

* * * * *